(12) United States Patent
Wu et al.

(10) Patent No.: US 9,071,266 B2
(45) Date of Patent: *Jun. 30, 2015

(54) MTR AND RLL CODE DESIGN AND ENCODER AND DECODER

(71) Applicant: SK hynix memory solutions inc., San Jose, CA (US)

(72) Inventors: Zheng Wu, San Jose, CA (US); Jason Bellorado, Santa Clara, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/151,656

(22) Filed: Jan. 9, 2014

(65) Prior Publication Data

US 2014/0191887 A1   Jul. 10, 2014

Related U.S. Application Data

(63) Continuation of application No. 13/436,187, filed on Mar. 30, 2012, now Pat. No. 8,659,450.

(60) Provisional application No. 61/477,968, filed on Apr. 21, 2011.

(51) Int. Cl.
| H03M 5/00 | (2006.01) |
| H03M 7/00 | (2006.01) |
| H03M 5/14 | (2006.01) |
| H03M 7/20 | (2006.01) |

(52) U.S. Cl.
CPC ............. *H03M 5/145* (2013.01); *H03M 7/20* (2013.01)

(58) Field of Classification Search
CPC ........................................... H03M 5/145
USPC ........................................ 341/58, 59
See application file for complete search history.

(56) References Cited

U.S. PATENT DOCUMENTS

| 6,018,304 | A | * | 1/2000 | Bessios ........................ 341/58 |
| 6,241,778 | B1 | * | 6/2001 | de Lind van Wijngaarden et al. ........................... 341/58 |
| 7,057,536 | B2 | * | 6/2006 | Lee et al. ..................... 341/59 |
| 2009/0027239 | A1 | * | 1/2009 | Coene .......................... 341/50 |
| 2011/0115655 | A1 | * | 5/2011 | Noda ............................ 341/59 |

OTHER PUBLICATIONS

Wijngaarden et al., A Combinatorial Technique for Constructing High-Rate MTR-RLL Codes, IEEE Journal on Selected Areas of Communications, vol. 19, No. 4 Apr. 2001, pp. 582-588.*

Demirkan et al., The Combined Constraints for Perpendicular Recording Channels, IEEE Transactions on Magnetics, Feb. 2006 vol. 42, No. 2 pp. 220-225.*

* cited by examiner

*Primary Examiner* — Howard Williams
(74) *Attorney, Agent, or Firm* — Van Pelt, Yi & James LLP

(57) ABSTRACT

An array f(n) is received for n=1, ..., N where N is a length of a codeword. An array g(n) is received for n=1, ..., N where N is a length of a codeword. Input data is encoded to satisfy an MTR constraint and a RLL constraint using the array f(n) and the array g(n).

16 Claims, 13 Drawing Sheets

MTR AND RLL CODE DESIGN AND ENCODER AND DECODER

CROSS REFERENCE TO OTHER APPLICATIONS

This application is a continuation of co-pending U.S. patent application Ser. No. 13/436,187, entitled MTR AND RLL CODE DESIGN AND ENCODER AND DECODER filed Mar. 30, 2012 which is incorporated herein by reference for all purposes, which claims priority to U.S. Provisional Patent Application No. 61/477,968 entitled GENERAL METHOD OF MTR-RLL CODE DESIGN AND ENCODER/DECODER IMPLEMENTATION filed Apr. 21, 2011 which is incorporated herein by reference for all purposes.

BACKGROUND OF THE INVENTION

Constrained codes modify input data in order to satisfy or impose some constraint on the input data. One example of a constrained code is a run-length limited (RLL) code, where the length of a run (e.g., consecutive zeros or ones) is limited to some range. For an RLL(d,k) code, the number of consecutive zeros between two ones cannot be less than d, nor can the number of consecutive zeros between two ones be larger than k. Another type of constrained code is a maximum transition run (MTR) code, where the number of transitions is limited. For example, an MTR(T) code imposes a limit of no more than T consecutive transitions in a sequence. It would be desirable if new techniques for code design and/or (e.g., hardware) implementation of corresponding encoders and decoders which satisfy both RLL and MTR constraints were developed. Some existing techniques, for example, cannot be applied to any code length and constraint directly, which makes implementing corresponding encoders and decoders for those codes extremely difficult. Putting a RLL encoder and MTR encoder back-to-back (i.e. concatenating them) in a write controller or transmitter will also not necessarily work because the constraint enforced first will not necessarily be satisfied after the second constraint is enforced. New techniques for designing MTR-RLL codes and associated encoders and decoders would therefore be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
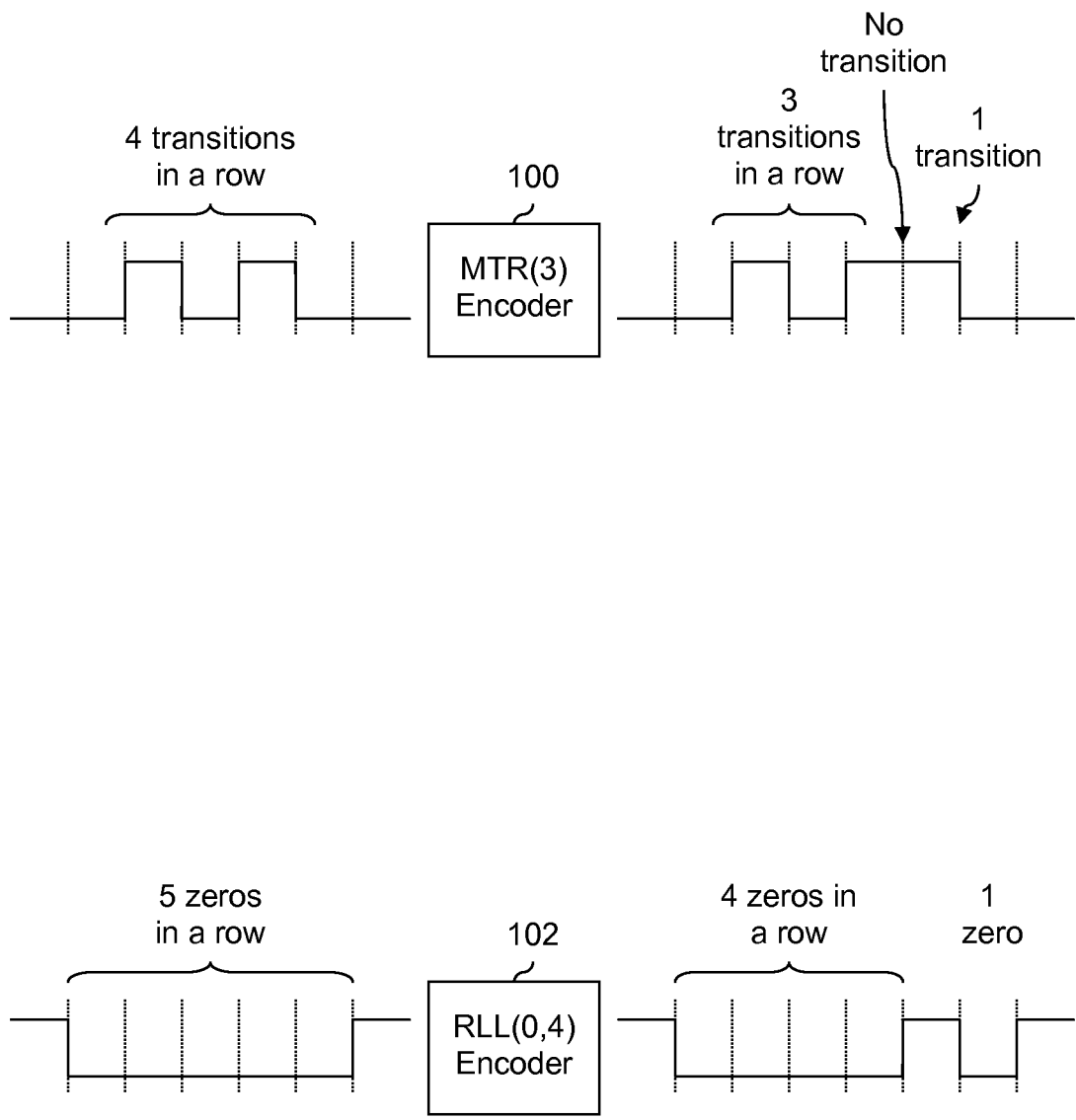
FIG. 1 is a diagram showing an example of a run-length limited (RLL) encoder and a maximum transition run (MTR) encoder.

FIG. 1 is a diagram showing an example of a run-length limited (RLL) encoder and a maximum transition run (MTR) encoder. The codewords of an RLL code are sequences of (d,k) constraint, where the number of consecutive zeros between two ones cannot be less than d, and larger than k. RLL encoder 102, for example, enforces an RLL(0,4) constraint. At the input of RLL encoder 102 is a signal which includes 5 zeros in a row. Since this violates the RLL code constraint, RLL encoder 102 processes the input signal and generates an output signal which includes 4 zeros in a row, 1 one, and then 1 zero. Put another way, RLL encoder 102 breaks up the 5 zeros in a row by inserting a one in the run of zeros. This is one example of how an RLL encoder enforces an RLL constraint; other RLL encoders may perform other modifications in other embodiments (e.g., insert a one after 3 zeros in a row, or mapping non-constraint sequences to constraint sequences with a look-up table).

In non-return-to-zero, inverted (NRZI) representation, where a zero represents no transition and a one represents a transition, a d constraint separates two transitions which can, in longitudinal magnetic recording, reduce the sequence error probability. The k constraint in a NRZI sequence provides the system with enough timing information since it can only be obtained from transitions in the written data sequence. The d constraint tends not to be used in current magnetic recording systems while the k constraint is used for timing recovery. In some embodiments, an MTR and RLL encoder or decoder is configured to operate in the NRZI domain (e.g., the output of the encoder is always a sequence where a 1 represent a transition and a 0 represent no transition). In writing to storage media, the output of some such encoders has to go through a pre-coder, for example changing 1's to transitions, and 0's to no transitions (i.e., changing the NRZI sequence to an NRZ sequence). On the read or receiver side, the corresponding decoder requires the input to be an NRZI sequence; therefore there is a pre-coder that changes NRZ sequence from drive to NRZI.

A MTR(T) constraint limits the run length of transitions to be no greater than T in a sequence. MTR encoder 100, for example, enforces an MTR constraint where T=3. At the input of MTR encoder 100 is a signal which includes 4 transitions in a row. (Note that the signals shown input to and output from MTR encoder 100 are in NRZ, not NRZI, format.) 4 transitions in a row violates the MTR constraint of T=3, so MTR encoder 100 breaks up the transitions by holding the signal high for one cycle. The output signal therefore includes 3 transitions in a row, the signal held high for one count (i.e., no transition), and then a transition (corresponding to the fourth transition in the input signal). As described above, this is one example of a modification performed by a MTR encoder to enforce a MTR constraint; other modifications may be performed by a MTR encoder.

In NRZI format, a MTR constraint means that the run length of consecutive ones cannot exceed the constraint T. A sequence with a MTR(T) constraint enforced in the NRZI domain will satisfy a RLL(0,T) constraint when the ones and zeros in the sequence are flipped. MTR codes improve error performance of a sequence by removing long consecutive transition runs, which tend to create error events in detectors. Enforcement of an MTR constraint causes a code rate penalty for the constraint (e.g., in the form of overhead information which must be added to enforce the MTR constraint).

It would be desirable if systematic and/or direct techniques for creating a code which satisfies both an MTR constraint and RLL constraint were developed. Put another way, such a technique would be able to construct a code when given as input: the desired MTR constraint, the desired RLL constraint, and an MTR-RLL code length of N. Although some techniques exist for creating codes which satisfy both RLL and MTR constraints exist, they tend to be crude and/or limited in their application (e.g., they cannot be applied to any code length and constraint directly). A technique is described herein which permits the systematic and/or direct design of a code which satisfied both an MTR constraint and an RLL constraint.

Figure 2:
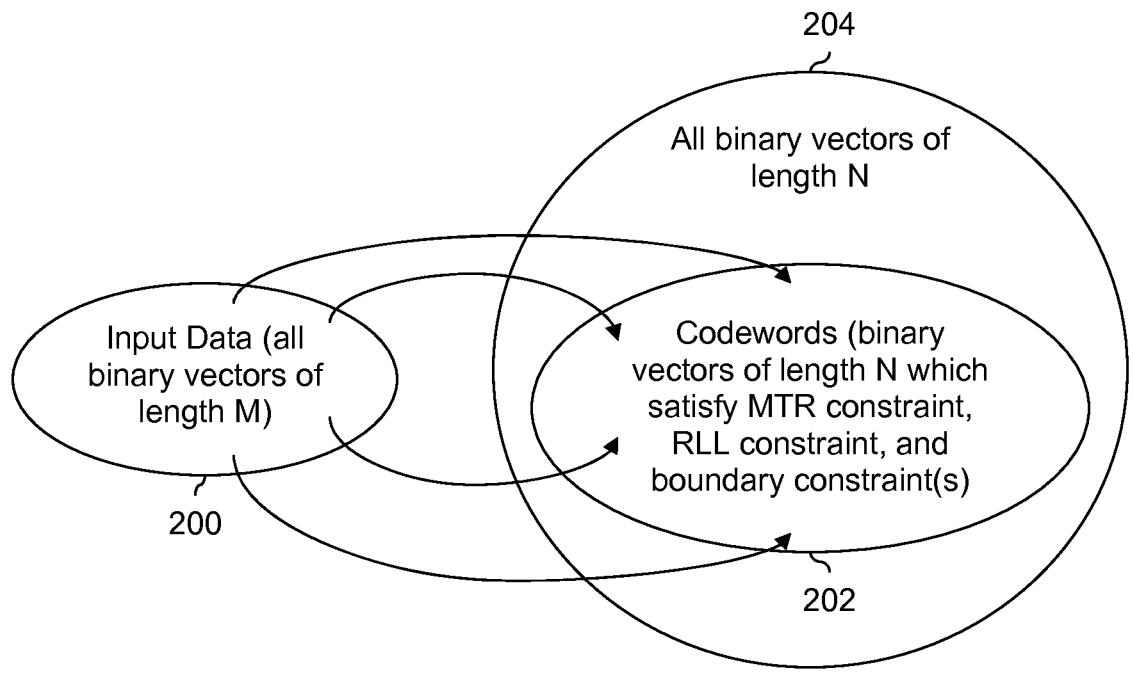
FIG. 2 is a diagram showing an embodiment of sets of data associated with constructing a code.
Figure 3:
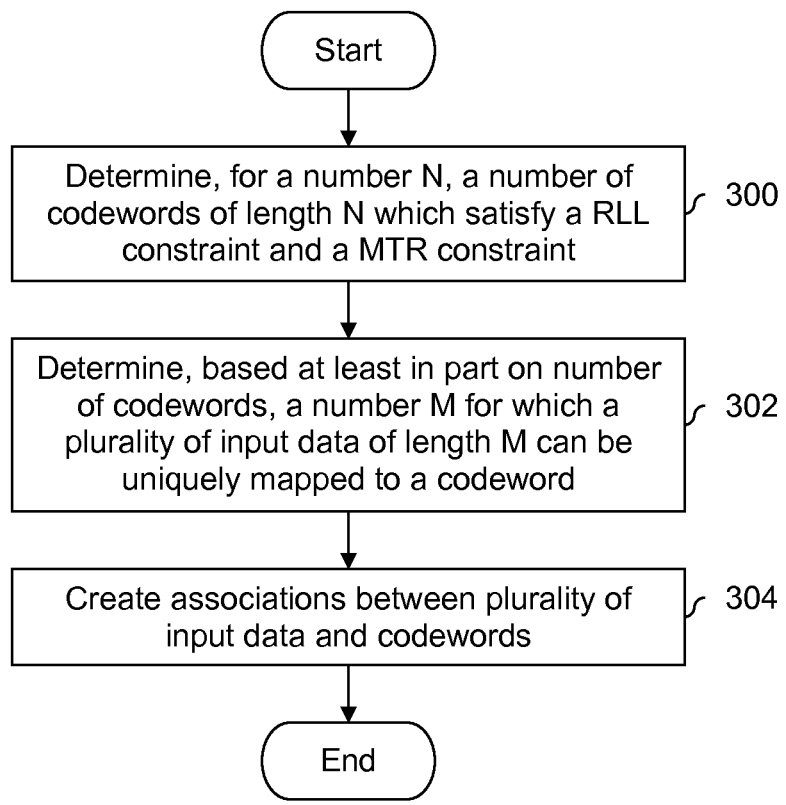
FIG. 3 is a flowchart illustrating an embodiment of a process for constructing a code when given a code length of N, a RLL constraint of (0,K), and a MTR constraint of T.

FIG. 2 is a diagram showing an embodiment of sets of data associated with constructing a code. FIG. 3 is a flowchart illustrating an embodiment of a process for constructing a code when given a code length of N, a RLL constraint of (0,K), and a MTR constraint of T. The example data sets shown in FIG. 2 are used to illustrate the example process shown in FIG. 3.

At 300, for a number N, a number of codewords of length N which satisfy a RLL constraint and a MTR constraint is determined. In some embodiment, this includes obtaining one or more boundary constraints (e.g., special rules that apply only at or near the boundary) and/or general constraints (e.g., that apply over the entire codeword, but which may be superseded at or near the boundary by more stringent boundary constraints).

Using the data sets shown in FIG. 2 as an example, given a code length of N (e.g., given as an input when designing a code), set 204 is the set of all binary vectors of length N. For example, if N=5, then set 204 includes (00000, 00001, . . . , 11110, 11111) where there are $2^5$=32 members in set 204. From the set of all binary vectors of length N (i.e., set 204), a set of codewords 202 is determined using the MTR constraint (T) and the RLL constraint (K). Codeword set 202 is a subset of set 204 and includes all binary vectors of length N which satisfy both the MTR constraint and RLL constraint (e.g., including one or more boundary constraints); step 300 in FIG. 3 counts the number of members (i.e., codewords) in codeword set 202. For example, if information is represented in NRZI form where 11111 corresponds to 5 transitions in a row, then that would not be a codeword if the MTR constraint is T=3, because 5 transitions in a row do not comply with the MTR(3) limitation of 3 transitions or fewer in a row. In some embodiments, step 300 includes counting paths in a trellis which satisfy the MTR constraint and RLL constraint; this is described in further detail below.

Returning to FIG. 3, at 302, a number M for which a plurality of input data of length M can be uniquely mapped to a codeword is determined based at least in part on a number of codewords. In FIG. 2, for example, if there are 18 codewords in set 202, then M=[$\log_2$ 18]=[4.1699]=4 in some embodiments and input data set 200 includes all binary vectors of length 4 (i.e., (0000, 0001, . . . , 1110, 1111)). By taking the floor of the logarithm, it is guaranteed that there will be enough codewords in set 202 so that each vector in input data set 200 can be mapped to its own codeword. If M in the example above is set to 5, then input data set 200 would have $2^5$=32 members and since there are only 18 codewords in codeword set 202, some input data values in set 200 would have to share the same codeword. This would make de-mapping and/or decoding at a receiver or read processor difficult.

Returning back to FIG. 3, associations are created between the plurality of input data and codewords at 304. In FIG. 2, for example, this is represented by the arrows originating in input data set 200 and ending in codeword set 202. Given as input a particular input value, a given codeword will be output; this describes the encoding performed by an MTR-RLL encoder. Prior to performing step 304, certain characteristics of the code are known (e.g., the code rate, M/N), but associating a particular input value to a particular codeword defines the specific codebook. For a given input data set 200 and a given codeword set 202, a variety of mappings exist and any one of them may be employed. In some embodiments, one or more thresholds are used to encode and/or otherwise associated or map an input data value to a particular codeword. Using thresholds may be desirable since it consumes relatively little processing and/or storage resources.

Figure 4:
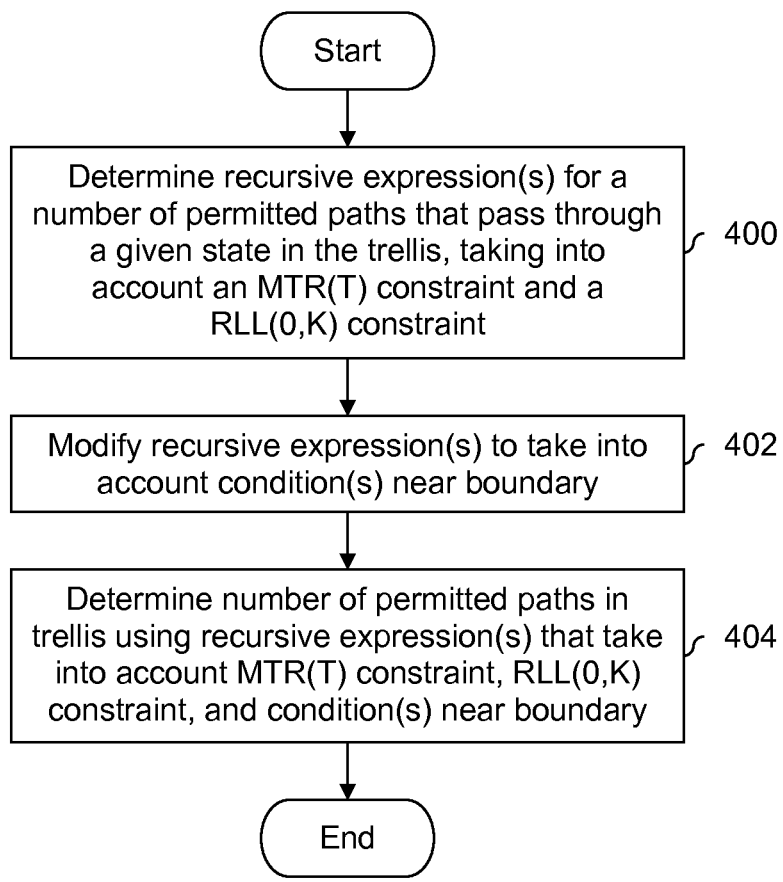
FIG. 4 is a diagram showing an embodiment of a process for using a trellis to determine a number of codewords which satisfy a RLL constraint and a MTR constraint.
Figure 5:
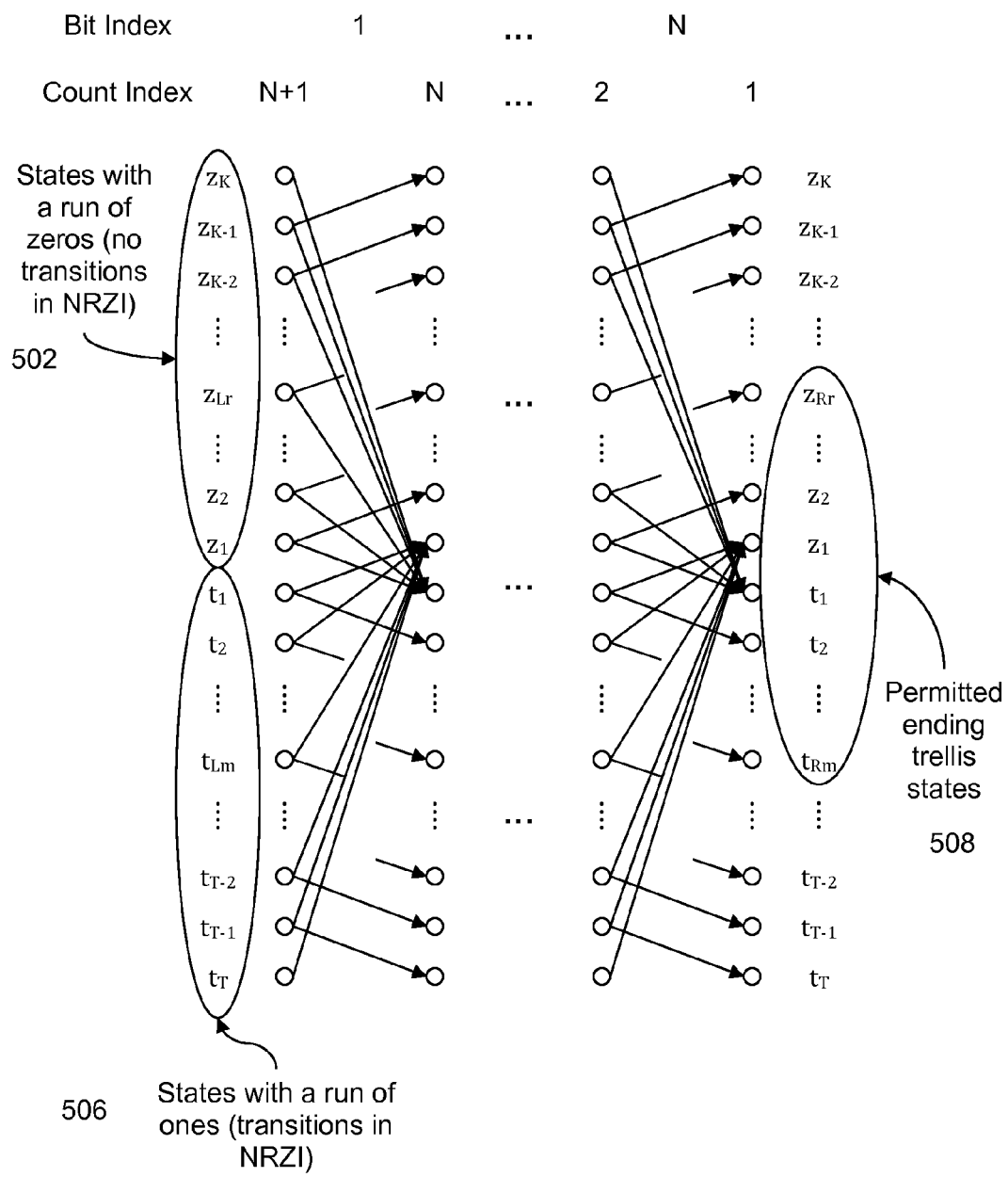
FIG. 5 is a diagram showing an embodiment of a trellis used in determining a number of codewords.
Figure 6:
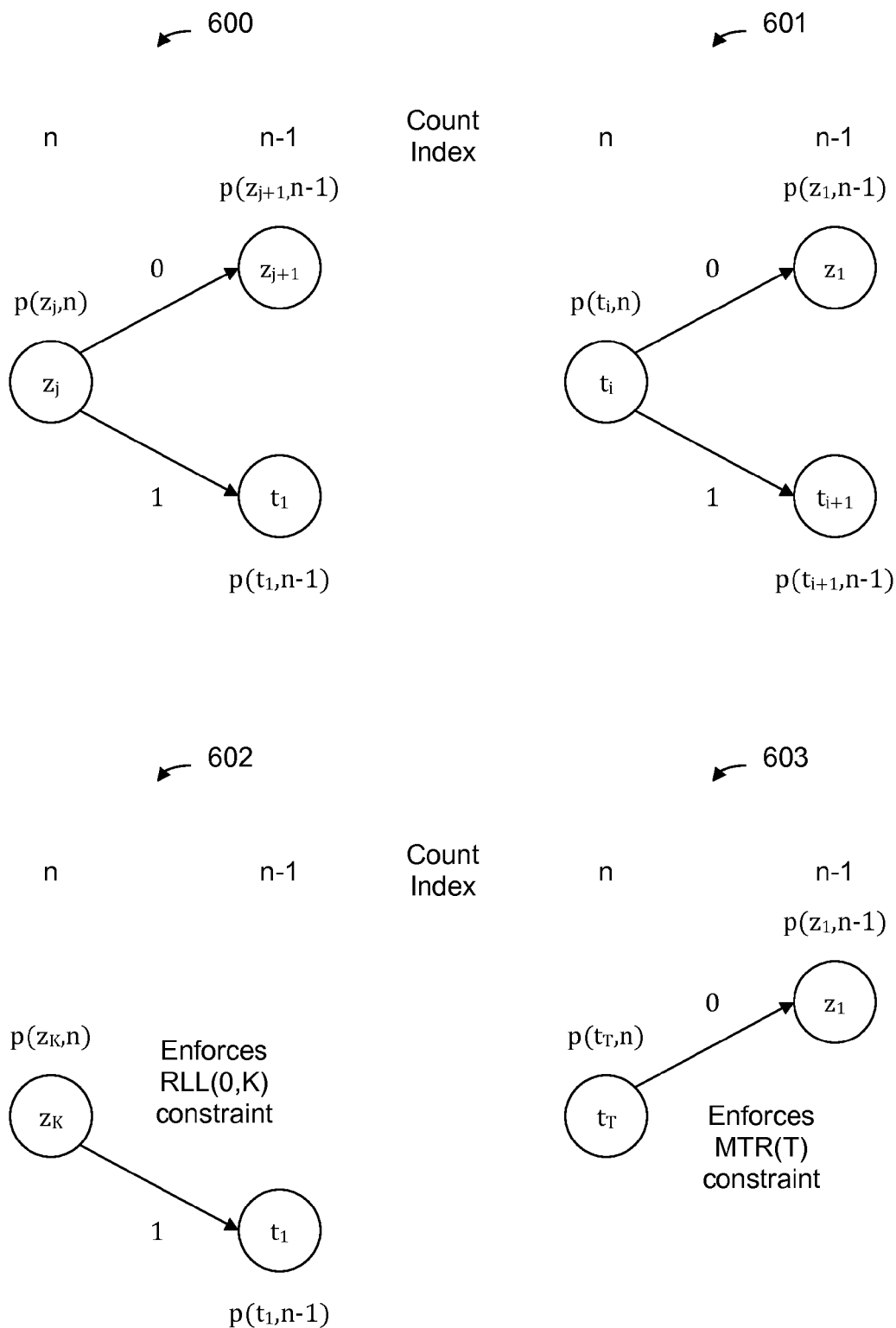
FIG. 6 is a diagram showing an embodiment of permitted state transitions associated with a trellis used in determining a number of codewords.

FIG. 4 is a diagram showing an embodiment of a process for using a trellis to determine a number of codewords which satisfy a RLL constraint and a MTR constraint. In some embodiments, step 300 in FIG. 3 is performed as shown. FIG. 5 is a diagram showing an embodiment of a trellis used in determining a number of codewords and FIG. 6 is a diagram showing an embodiment of permitted state transitions associated with a trellis used in determining a number of codewords. To illustrate the process described in FIG. 4, reference is made to the trellis shown in FIG. 5 and the permitted state transitions shown in FIG. 6.

At 400, recursive expression(s) is/are determined for a number of permitted paths that pass through a given state in the trellis, taking into account an MTR(T) constraint and a RLL(0,K) constraint. Trellis 500 in FIG. 5 is one embodiment of such a trellis which is used to count codewords. Trellis 500 is a trellis of N+1 state stages (N branch stages). Paths on the trellis from starting state(s) to ending state(s) are codewords (in this example, in the NRZI domain) of the code. The states in trellis 500 are $\{t_T, t_{T-1}, \ldots, t_1, z_1, z_2, z_K\}$, where a run length of ones ending at state $t_i$ (where i=1, T) is i, and a run length of zeros ending at state $z_j$ (where j=1, K) is j. For example, state $t_5$ is a state in which a signal is experiencing a run of ones of run length 5. State $z_{10}$ is a state in which a signal is experiencing a run of zeros of run length 10. In trellis 500, states 502 are those with a run of zeros (no transitions in NRZI) and states 506 are those with a run of ones (transitions in NRZI).

At each state in trellis 500, the outgoing branches have a bit corresponding either to a zero or a one. Diagrams 600-603 in FIG. 6 show the four permitted possibilities of all states with their outgoing branches for trellis 500. Unless stated otherwise, the representations described below are in NRZI format, where a one corresponds to a transition (e.g., low to high or high to low) and a zero corresponds to no transition. In diagram 601, the next state of state $t_i$ is always $z_1$ when the next bit is a zero. When the next bit is a one, the next state of $t_i$ is $t_{i+1}$. In diagram 603, state $t_T$ can only have zero as a next bit since the run length of the incoming ones is T and a run length of ones greater than T is not allowed. This enforces the MTR(T) constraint. In diagram 600, the next state of state $z_j$ is always $t_1$ when the next bit is a one, and $z_{j+1}$ when the next bit is a zero. In diagram 602, state $z_K$ does not allow a zero as the next bit because of the run length constraint for zeros. This enforces the RLL(0,K) constraint and the only permitted next state is $t_1$.

Returning back to FIG. 4, step 400 (as described above) determines recursive expression(s) for a number of permitted paths. In some embodiments, this includes determining recursive path count expressions for state $z_j$ at count index n in diagram 600, for state $t_i$ at count index n in diagram 601, for state $z_K$ at count index n in diagram 602, and for state $t_T$ at count index n in diagram 603. In some embodiments described herein, for a codeword bit index (e.g., used when mapping or otherwise transforming an input data value to a codeword) progression goes from left to right, but when counting a number of codewords (e.g., as in step 400), a count index going from right to left is used. Note that as shown in FIG. 5, in addition to their difference in direction of progression, the bit index corresponds to transitions between states and the count index to the states themselves.

Figure 8:
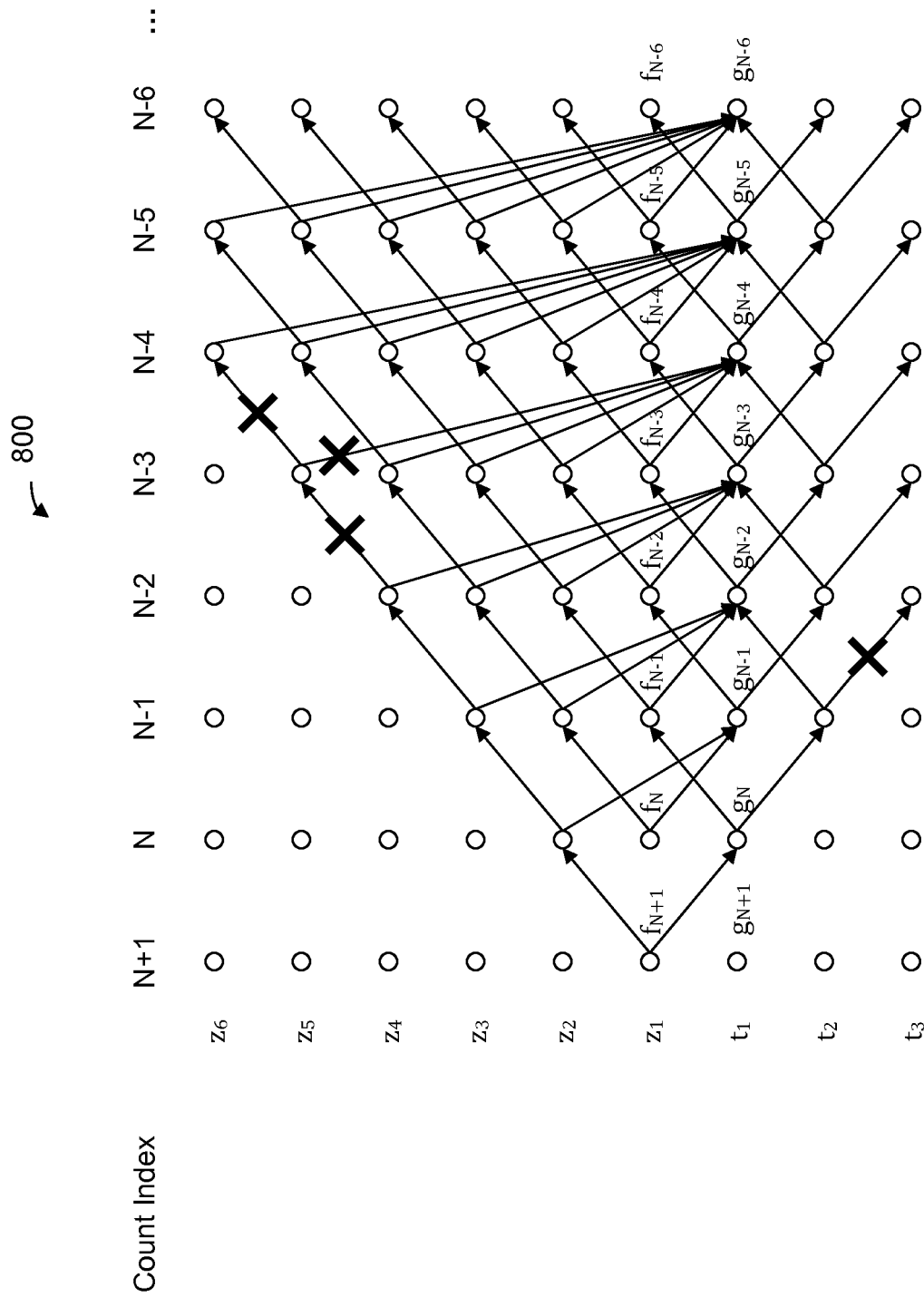
FIG. 8 is a diagram showing an example of a left boundary of a trellis.

At 402 in FIG. 4, recursive expression(s) is/are modified to take into account condition(s) near a boundary. For example, a recursive expression obtained at 400 using a count index going from right to left in a trellis is modified to account for one or more boundary constraints, which impose even more stringent rules (e.g., compared to a MTR or RLL constraint which applies over an entire codeword) when at or near a boundary. Boundary constraints on trellis 500 in FIG. 5 are used to ensure that MTR and RLL constraints are satisfied when codewords are concatenated together. $L_m$ and $R_m$ are the maximum number of transitions a codeword can start with and end with respectively, and $L_r$ and $R_r$ are the maximum number of zeros a codeword can start with and end with respectively. Thus, at the boundary of two concatenated codewords, there are at most $L_m+R_m$ transitions and $L_r+R_r$ zeros. States 508 are the permitted ending trellis states which satisfy the ending boundary conditions of $L_r$ and $R_r$. Note that (e.g., practically), in the encoding/decoding process there is one starting state. For example, this state can be either t1 or z1. A valid codeword path can start in other starting states; assuming a start occurs in one state may be for encoding/decoding convenience. When proceeding from such a single, assumed starting state (e.g., t1 or z1), the paths for boundary condition are limited as shown in FIG. 8 Boundary conditions are selected such that the performance at the codeword boundary will not be degraded significantly because of consecutive transitions or zeros when two codewords are concatenated together. Note that the boundary constraints $L_m$, $R_m$, $L_r$, and $R_r$ may be any value, including zero.

Returning back to FIG. 4, a number of permitted paths in a trellis is determined using recursive expression(s) that take into account MTR(T) constraint, RLL(0,K) constraint, and condition(s) near a boundary at 404. For example, to solve recursive equations in general, an initial or starting value for the recursive expression is used to solve the equation.

To more clearly illustrate the process described in FIG. 4, a more detailed description follows. First, one or more recursive expressions is/are determined. Starting from a particular state in the trellis, there are a number of paths that reach the end of the trellis. These distinct paths correspond to all codewords that have the same prefix ending at that state. Let the number of paths starting from state s at count index n to be p(s,n), where for n=2, ..., N+1:

$$p(t_i, n) = p(t_{i+1}, n-1) + p(z_1, n-1); i=1, \ldots, T-1$$

$$p(z_j, n) = p(z_{i+1}, n-1) + p(t_1, n-1); j=1, \ldots, K-1$$

$$p(t_T, n) = p(z_1, n-1)$$

$$p(z_K, n) = p(t_1, n-1) \quad (1)$$

The path counts in (1) are shown in FIG. 6. The path count $p(t_i,n)=p(t_{i+1},n-1)+p(z_1,n-1)$ is shown in diagram 601 where the number of paths starting from state $t_i$ at count index n is the number of paths starting from state $t_{i+1}$ at count index n−1 plus the number of paths starting from state $z_1$ at count index n−1. This is because the only permitted transitions out of state $t_i$ at count index n is to either state $t_{i+1}$ (i+1<=T) at count index n−1, with a transition '1', or to state $z_1$ at count index n−1 with a no-transition '0'. As such, the number of paths passing through state $t_i$ at count index n is the sum of paths passing through those two states at those two count indices. Similarly, the path count $p(z_j,n)=p(z_{i+1},n-1)+p(t_i,n-1)$ is shown in diagram 600, j<K. The path count $p(t_T,n)=p(z_1, n-1)$ is shown in diagram 603 and the path count $p(z_K,n)=p(t_1,n-1)$ is shown in diagram 602. The path counts in (1) are examples of recursive expressions which are determined at step 400 in FIG. 4.

The state t1 and z1 are two special states. The path counts on these two states will be used in the code construction and encoding/decoding design. To simplify the recursive relationship expression, Let $f_n=p(z_1,n)$ (i.e., the number of paths starting from state $z_1$ at count index n) and $g_n=p(t_1,n)$ (i.e., the number of paths starting from state $t_1$ at count index n), the recursive relationship in equation (1) can be expressed as:

$$f_n = \sum_{i=1}^{K} g_{n-i} \quad (2)$$

-continued $$g_n = \sum_{i=1}^{T} f_{n-i} \quad (3)$$

Boundary constraints affect the recursive equations above when n is close to the boundary. Taking the right side boundary condition as an example, the trellis ending states are restricted to states 508 in FIG. 5 (i.e., $\{t_{Rm}, t_{Rm-1}, \ldots, t_1, Z_1, \ldots, z_{Rr-1}, z_{Rr}\}$). The following figures show some embodiments of how a recursive expression for a path count is modified to take into account a boundary condition.

Figure 7:
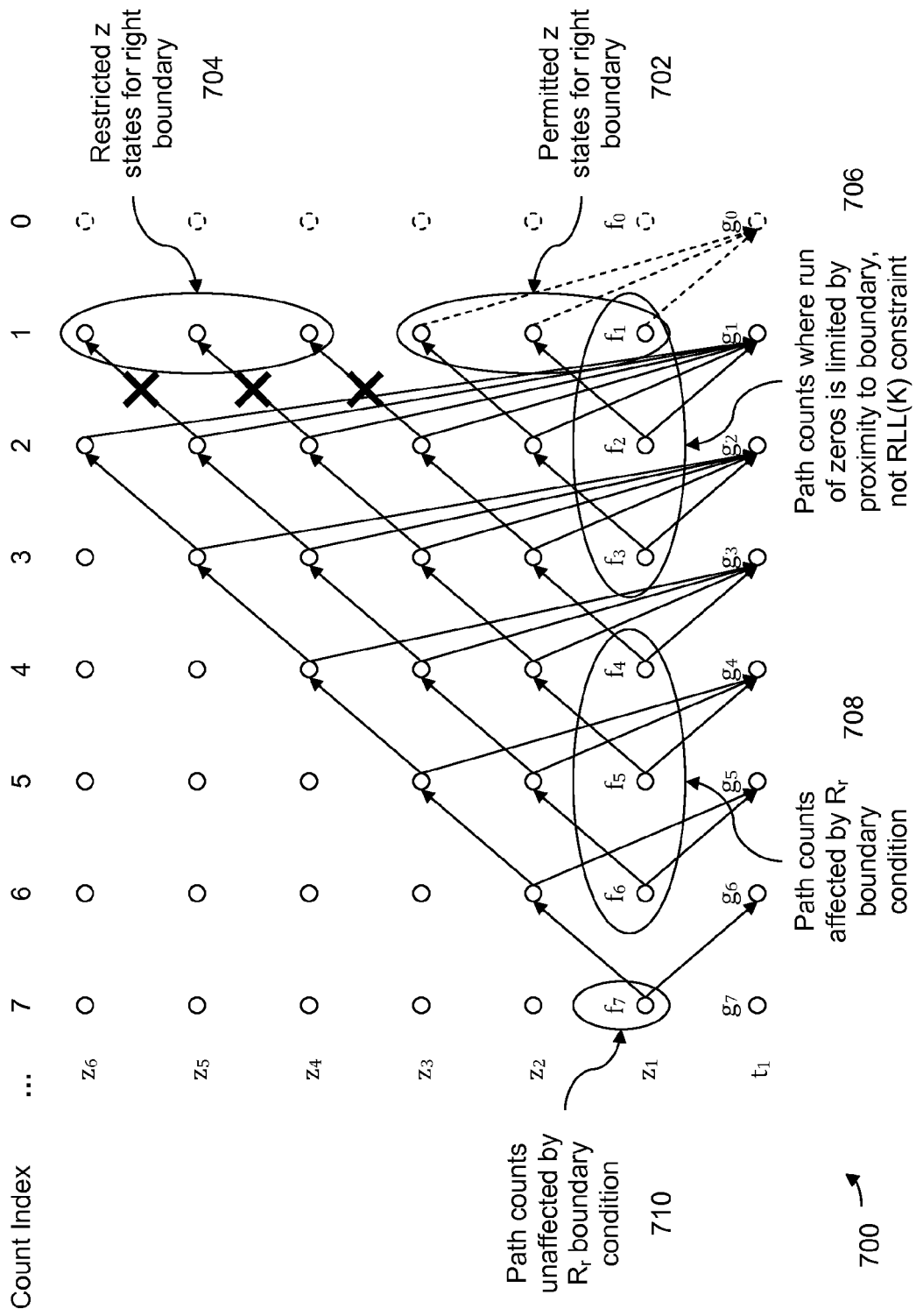
FIG. 7 is a diagram showing an embodiment of a right boundary of a trellis.

FIG. 7 is a diagram showing an embodiment of a right boundary of a trellis. In the example shown, $R_r=3$ and $K=6$. The example focuses on the RLL right boundary condition. Using the example shown, path counts expressed in iterative form are modified to take into account one or more conditions near a boundary. For example, this includes MTR or RLL boundary conditions, or a proximity to a boundary where consecutive transitions or runs of a particular value are limited by a proximity to a boundary as opposed to an MTR or RLL constraint, respectively. In other words, the boundary is reached before some limit or constraint is reached. For clarity, some aspects of a full trellis are not necessarily shown in trellis 700 (e.g., all count indices, all states, all transitions, etc. are not necessarily shown).

With respect to the z states, the permitted ending z states for the right boundary are states 702 (i.e., states $z_1$, $z_2$, and $z_3$) and the restricted z states for the right boundary are states 704 (i.e., states $z_4$, $z_5$, and $z_6$). Note, for example, that the three X's between count index 1 and 2 (which come about because of the restriction $R_r=3$) can be traced back to path counts $f_4$ through $f_6$. The state at count index zero was drawn for convenience of recursion and may be thought of, conceptually, as a virtual count index. In this example, $g_0=f_0=1$ and only allowed ending states 702 can go to state $t_1$ or $z_1$ at count index zero. As shown in trellis 700, from count index 4 to 6, any run of zeros that tries to reach the right boundary of the trellis is terminated by a one at the last bit, which is due to the $R_r$ constraint. See, for example, the three X's between count index 1 and 2. A similar situation will happen to Rm constraint. The restriction of $R_m$ will affect sequence $\{g_n\}$, while $R_r$ will affect sequence $\{f_n\}$.

In general, $f_n$ at or near the end (i.e., right boundary) of the trellis can be written as:

$$f_n = \begin{cases} \sum_{i=1}^{n} g_{n-i} & 1 \le n \le R_r \\ \sum_{i=1}^{n-1} g_{n-i} & R_r < n \le K \\ \sum_{i=1}^{K} g_{n-i} & n > K \end{cases} \quad (4)$$

The path counts in (4) show an embodiment of a modification made to a recursive expression of a path count and is one example of a modification made at step 402 in FIG. 4. Note that the expressions shown in (4) take into account the right boundary and the $R_r$ constraint; the left boundary and other constraints (e.g., $R_m$, $L_r$, and $L_m$) may require additional modifications not necessarily reflected in (4).

For the specific conditions shown in trellis 700 where $R_r=3$ and $K=6$, the path counts for count indices 1 through 7 are shown in the table below (reference table I). The first set of path counts (i.e., for $1 \le n \le R_r$) is shown in trellis 700 as path counts 706, which are the path counts where a run of zeros is limited by a proximity to the right boundary and not the $K=6$ constraint or $R_r=3$ constraint. Put another way, path counts $f_1$ through $f_3$ will hit the right boundary between count index 1 and 0 (e.g., via paths $(z_1,3) \rightarrow (z_2,2) \rightarrow (z_1,1)$, $(z_1,2) \rightarrow (z_2,1)$ and $(z_1,1)$) before either the $K=6$ constraint or $R_r=3$ is reached. However, the $f_n$ path count expression in (2) did not account for this boundary between count index 1 and 0 and therefore must be modified. This is reflected in the first branch of equation (4)

The second set of path counts (i.e., for $R_r < n \le K$) is shown in trellis 700 as path counts 708 where the path counts are affected by the boundary condition $R_r$. Specifically, a run of zeros which would otherwise be acceptable under the RLL (K=6) constraint is now no longer acceptable because of the boundary constraint of $R_r=3$. The three X's between count index 1 and 2 indicate transitions which would have been permitted with the RLL(K=6) constraint but which are not permitted under the $R_r=3$ boundary constraint. As such, the $f_n$ path count expression in (2) is modified to account for this. This is reflected in the second branch of equation (4).

The third set of path counts (i.e., n>K) is shown as set 710. Note that for clarity, count index 8 and above is not shown in trellis 700 but path count 710 may include path counts in addition to $f_7$ (e.g., set 710 also includes $f_8, f_9, \ldots$). As is shown in trellis 700, neither proximity to the right edge nor the right boundary constraint of $R_r=3$ affect those path counts, and therefore the expression for $f_n$ for those count indices is the same as that shown in (2). See, for example, the third branch of equation (4).

For the modifications associated with path count sets 706 and 708, the effects can be reflected by modifying the affected path count(s) in (1). Specifically, $p(z_j,n)=p(z_{j+1},n-1)+p(t_1,n-1); j=1, \ldots, K-1$ from (1) above no longer holds for all cases (i.e., for all $j=1, \ldots, K-1$). Once $p(z_j,n)$ is modified (e.g., by having sub-functions for different ranges) to reflect the effects associated with path counts 706 and 708, the recursive nature of the expression can be used to obtain the path count expressions shown in (4). The table below shows $f_1$ through $f_7$ evaluated for the example shown in FIG. 7.

TABLE 1

Example path counts corresponding to FIG. 7.

| | | |
|---|---|---|
| $1 \le n \le 3$ | $f_n = \sum_{i=1}^{n} g_{n-i}$ | $n=1$ : $f_1 = \sum_{i=1}^{1} g_{1-i} = g_0$ |
| | | $n=2$ : $f_2 = \sum_{i=1}^{2} g_{2-i} = g_0 + g_1$ |
| | | $n=3$ : $f_3 = \sum_{i=1}^{3} g_{3-i} = g_0 + g_1 + g_2$ |
| $3 < n \le 6$ | $f_n = \sum_{i=1}^{n-1} g_{n-i}$ | $n=4$ : $f_4 = \sum_{i=1}^{3} g_{4-i} = g_1 + g_2 + g_3$ |
| | | $n=5$ : $f_5 = \sum_{i=1}^{4} g_{5-i} = g_1 + \ldots + g_4$ |
| | | $n=6$ : $f_6 = \sum_{i=1}^{5} g_{6-i} = g_1 + \ldots + g_5$ |

TABLE 1-continued

Example path counts corresponding to FIG. 7.

| $n < 6$ | $n = 7$ |
|---|---|
| $f_n = \sum_{i=1}^{K} g_{n-i}$ | $f_7 = \sum_{i=1}^{6} g_{7-i} = g_1 + \ldots + g_6$ |

The boundary condition of $R_m$ has similar effect on the computation of $g_n$ close to the right boundary (not shown in trellis 700, nor in Table 1). The path count in (3) can be modified to account for $R_m$, which results in:

$$g_n = \begin{cases} \sum_{i=1}^{n} f_{n-i} & 1 \leq n \leq R_m \\ \sum_{i=1}^{n-1} f_{n-i} & R_m < n \leq T \\ \sum_{i=1}^{K} f_{n-i} & n > T \end{cases} \quad (5)$$

The following figure shows an example of a left boundary of a trellis and a modification to a path count which takes into account one or more left boundary constraints and/or how a left boundary itself affects a path count.

FIG. 8 is a diagram showing an example of a left boundary of a trellis. For clarity, the trellis shown is only a portion of a trellis and some aspects of a complete trellis are not necessarily shown. As in the previous example which shows a right boundary, the trellis portion shown herein is used to modify a path count, for example to take into account restrictions related to the left boundary.

The left boundary condition is shown on the trellis somewhat differently than the right boundary example above. For encoding/decoding purposes, a fixed starting state is selected. However, not all states can satisfy both RLL and MTR boundary constraints without modifying trellis 800. The runs starting from the first state are restricted in order to satisfy the boundary condition. In the example shown, $L_r=3$, $L_m=2$, $K=6$ and $T=3$. In this example, state $z_1$ is the starting state, thus a run of zeros is limited to $L_r$ starting from index N+1. This is shown in trellis 800 as the X between count indices N−2 and N−3. Because of this canceling of the branch, any paths starting from the state Z5 at count N−3 will be cancelled in path counting and encoding/decoding. Note that count index N+1 is the boundary at which a boundary constraint (as well as an MTR or RLL constraint) begins to check. As such, although the beginning state is $z_1$ (corresponding to run of zeros of length 1), that zero does not count against the left boundary constraint of $L_r=3$. The zeros, however, associated with the transition from state $z_1$ at bit count N+1 to state $z_2$ at bit count N, the transition from state $z_2$ at bit count N to state $z_3$ at bit count N−1, and the transition from state $z_3$ at bit count N−1 to state $z_4$ at bit count N−2 do count towards the $L_r$ limit of 3 and thereafter another zero is not permitted (hence, the X between state $z_4$ at bound index N−2 and state $z_5$ at count index N−3). Conceptually, the starting state of $z_1$ is not a state corresponding to already having one zero in the sequence (at least, as employed here). Alternatively, $t_1$ may be selected as the starting state, but then the same situation occurs when counting the number of transitions in the following statement.

Similarly, a run of ones needs to be limited to $L_m$ (Lm=2). As such, the transition from state $t_2$ at count index N−1 to state $t_3$ at count index N−2 is not permitted and is shown with an X (e.g. because there is a first one associated with the transition between from state $z_1$ at count index N+1 to state $t_1$ at count index N plus a second one from the transition from state $t_1$ at count index N to state $t_2$ at count index N−1 and subsequent ones are not permitted). For the path count associated with state $z_1$ at count index N+1 (i.e., $f_{N+1}$) and the path count associated with state $t_1$ at count index N (i.e., $g_N$), they are (as a result of the conditions associated with the left boundary described above):

$$f_{N+1} = \sum_{i=1}^{L_r+1} g_{N+1-i} \quad (6)$$

$$g_N = \sum_{i=1}^{L_m} f_{N-i} \quad (7)$$

In this case where we select z1 as the starting state, the value of $f_N$ does not affect code design or encoding/decoding.

Alternatively, state $t_1$ may be used as the starting state instead of state $z_1$ (not shown in trellis 800). In that case, the path count associated with state $z_1$ at count index N (i.e., $f_N$) is:

$$f_N = \sum_{i=1}^{L_r} g_{N-i} \quad (8)$$

The total number of codewords equals to $f_{N+1}$ when state $z_1$ is the starting state, or equals $g_{N+1}$ when state $t_1$ is the starting state. They both equal to $f_N+g_N$ if we $f_N$ and $g_N$ are defined as in equations (7) and (8).

In the embodiments described above, it has been assumed that the trellis is a time-invariant trellis (i.e., a trellis which has the same trellis for each stage except those related to boundary conditions). The technique is not necessarily so limited and the trellis does not need to be time-invariant (e.g., at each stage, the constraints K and T does not need to be constant and they can be variables depending on stage index n). Let K(n) represent the maximum run-length of zeros starting from index n and T(n) represent the maximum run length of ones starting from index n. Therefore, for n=1, . . . , N:

$$f_n = \sum_{i=1}^{K(n+1)} g_{n-i} \quad (9)$$

$$g_n = \sum_{i=1}^{T(n+1)} f_{n-i} \quad (10)$$

with an initial condition of $f_0=1$ and $g_0=1$. Equations (9) and (10) are equations (2) and (3) where K and T are generalized to include time-varying constraints.

The boundary conditions may be reflected in the sequences of K(n) and T(n). For example, consider the previous case of (K, T, $L_m$, $L_r$, $R_m$, $R_r$) constraint as a special case of K(n) and T(n):

$$K(n) = \begin{cases} n-1 & n = 1, \ldots, R_r+1 \\ n-2 & n = R_r+2, \ldots, K+1 \\ K & n = K+2, \ldots, N \\ L_r & n = N+1 \end{cases} \quad (11)$$

$$T(n) = \begin{cases} n-1 & n = 1, \ldots, R_m+1 \\ n-2 & n = R_m+2, \ldots, T+1 \\ T & n = T+2, \ldots, N \\ L_m & n = N+1 \end{cases} \quad (12)$$

Returning to FIG. 3, step 300 is to determine a number of codewords which satisfy a RLL constraint and a MTR constraint. In the embodiments described above, the total number of codewords is $f_N+g_N$. Step 302 is to then determine the value of M based on the number of codewords. For example, any binary vector of length $M=\lfloor \log_2 (f_N+g_N) \rfloor$ is able to be encoded to a unique codeword of which satisfies the given constraint; the code rate of the code is R=M/N.

The embodiments above describe a technique for designing a MTR-RLL code given a code length N and constraints associated with MTR and RLL coding (e.g., including boundary constraints $L_m$, $R_m$, $L_r$, and $R_r$ and general MTR and RLL constraints which apply over the entire codeword). The figures below (which figures?) describe some encoder and decoder embodiments which are configured to perform MTR and RLL encoding, for example with a code designed according to the techniques described above. In some embodiments, a MTR-RLL code is designed using some other technique.

Figure 9:
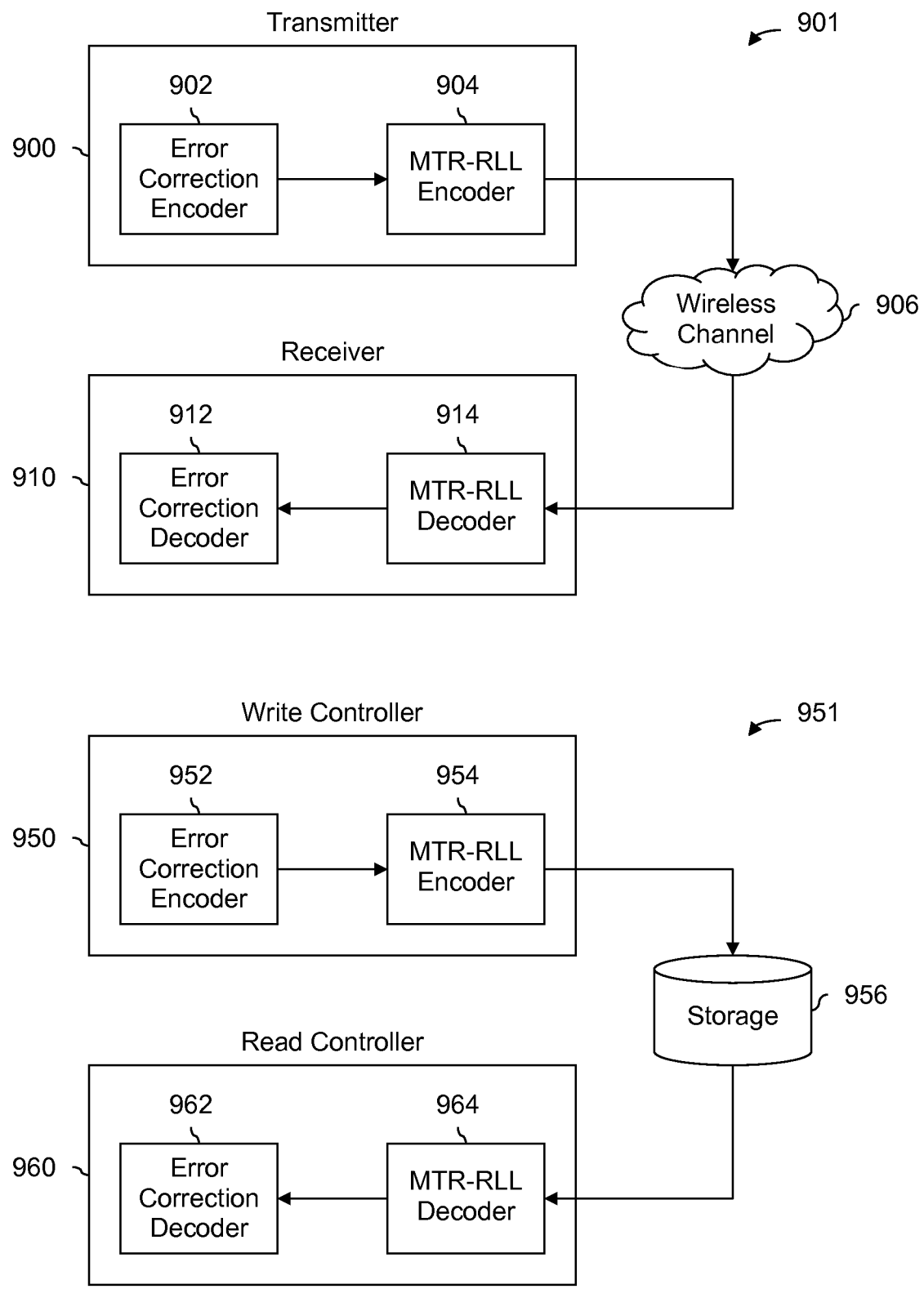
FIG. 9 is a diagram showing various embodiments of MTR-RLL encoders and decoders.

FIG. 9 is a diagram showing various embodiments of MTR-RLL encoders and decoders. In the example shown, system 901 is a communications system and system 951 is a storage system. In communications system 901, receiver 910 receives a signal from transmitter 900 via wireless channel 906; in storage system 951, read controller 960 receives a signal from write controller 950 via storage 956, for example after an amount of time has passed since storage 956 was written to by write controller 950. The ECC codec and the constrained codec can also be reversed in some embodiments.

In the example shown, MTR-RLL encoders 904 and 954 are configured to encode an input signal so that the output signal meets MTR and RLL constraints. For every M bits input by encoders 904 and 954, N bits are output. In some embodiments, the code is designed as described above. Conversely, MTR-RLL decoders 914 and 964 perform the inverse functions and for every N bits taken in, M bits are output.

Communications system 901 and storage system 951 in this example use error correction codes (e.g., performed by error correction encoders 902 and 952 and error correction decoders 912 and 962). In various embodiments, a variety of error correction codes such as low-density parity-check (LDPC) codes, Bose Ray Chaudhuri (BCH) codes, Reed-Solomon (RS) codes, and such are used. In some embodiments, a system uses multiple error correction codes. For clarity, some components are not necessarily shown herein but may be including, including (but not limited to) components related to acquisition, correction, interleaving, modulation, etc.

In various embodiments, an encoder or decoder (such as MTR-RLL encoders 904 and 954 and MTR-RLL decoders 914 and 964) are implemented in a variety of ways. In some embodiments, an MTR-RLL encoder or decoder is implemented as a semiconductor device, such as an application-specific integrated circuit (ASIC), field-programmable gate arrays (FPGA), or using a processor, such as an embedded ARM processor.

Figure 10:
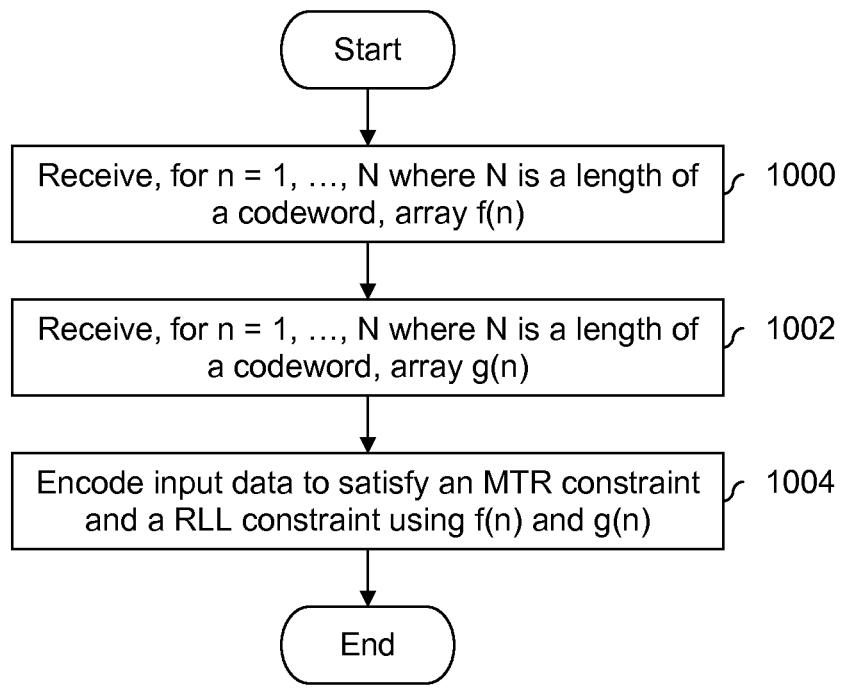
FIG. 10 is a diagram showing an embodiment of a process to perform MTR-RLL encoding on input data.

FIG. 10 is a diagram showing an embodiment of a process to perform MTR-RLL encoding on input data. In some embodiments, the process is performed by MTR-RLL encoder 904 or 954 in FIG. 9.

At 1000, for n=1, . . . , N where N is a length of a codeword, an array f(n) is received. In some embodiments, given the requirement of a code design, an array of f(n) for a specific code is pre-calculated according to equation (9) (or, alternatively, equations (2), (4), (8) which is a special case of (9)), with a time-invariant trellis except at the boundary), and stored in the memory.

TABLE 2

Example f(n) array used to MTR-RLL encode input data.

| n | $1 \leq n \leq R_r$ | $R_r < n \leq K$ | $K < n < N$ | $n = N$ |
|---|---|---|---|---|
| $f_n$ | $f_n = \sum_{i=1}^{n} g_{n-i}$ | $f_n = \sum_{i=1}^{n-i} g_{n-i}$ | $f_n = \sum_{i=1}^{K} g_{n-i}$ | $f_N = \sum_{i=1}^{L_r} g_{N-i}$ |

At 1002, for n=1, . . . , N where N is a length of a codeword, an array g(n) is received. The table below shows an example of the array g(n) which are obtained from equations (5) and (7). As above wi, in some embodiments, an array of g(n) for a specific code is pre-calculated according to equation (10) (or equation (3), (5), (7) which is a special case of (9)), with time-invariant trellis except the boundary), and stored in the memory.

TABLE 3

Example g(n) array used to MTR-RLL encode input data.

| n | $1 \leq n \leq R_m$ | $R_m < n \leq T$ | $T < n < N$ | $n = N$ |
|---|---|---|---|---|
| $g_n$ | $g_n = \sum_{i=1}^{n} f_{n-1}$ | $g_n = \sum_{i=1}^{n-1} f_{n-i}$ | $g_n = \sum_{i=1}^{K} f_{n-i}$ | $g_N = \sum_{i=1}^{L_m} f_{N-i}$ |

At 1004, input data is encoded to satisfy an MTR constraint and a RLL constraint using f(n) and g(n). For example, a process of comparing input data to one of the elements in array f(n) or g(n) (e.g., based on a previous codeword bit output) and deciding whether to output a zero or one based on the comparison, and updating the input data if needed may be performed. The following figure describes one such embodiment in more detail.

Figure 11:
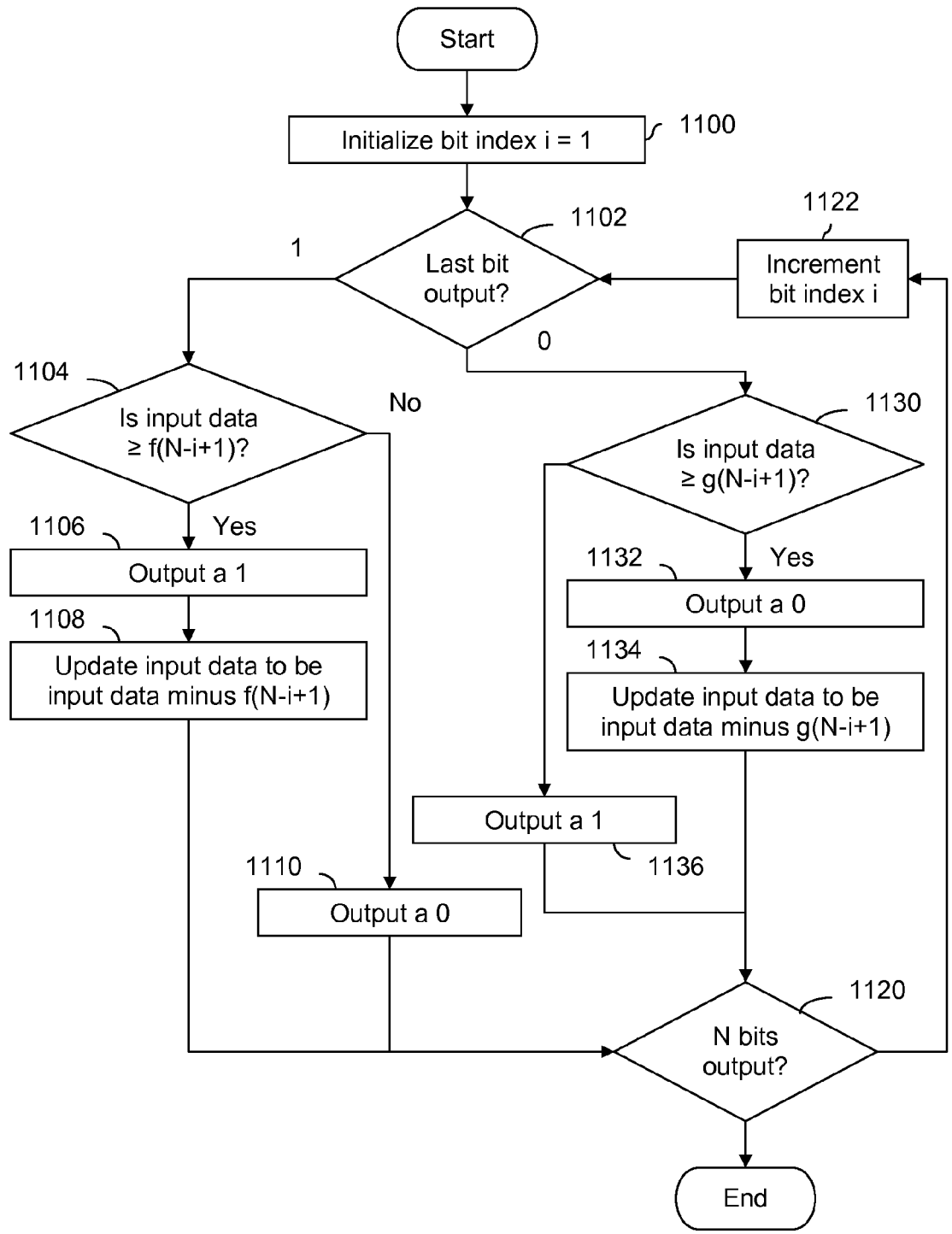
FIG. 11 is a diagram showing an embodiment of a process for performing MTR-RLL encoding, including by adding or subtracting using elements in array f(n) or g(n).

FIG. 11 is a diagram showing an embodiment of a process for performing MTR-RLL encoding, including by adding or subtracting using elements in array f(n) or g(n). In some embodiments, step 1004 in FIG. 10 is performed as shown. At 1100, a bit index i is initialized to 1. At 1102, the last bit output is evaluated. For example, MTR-RLL encoder 904 or 954 in FIG. 9 may output a series of bits, and the last (e.g., codeword) bit output by an MTR-RLL encoder may be evaluated at 1102. In some embodiments, during an initial cycle (e.g., i=1), the last bit output is set to a zero.

If the last bit output is a one, it is determined at 1104 if the input data is greater than or equal to f(N−i+1) (that is, the element in array f(n) at index n=N−i+1). Table 2 gives an example of a f(n) array. At least during an initial cycle (where i=1), the input data is the data input to an MTR-RLL encoder; the input data may be updating during the encoding process and if so the updated value is used at 1104. If the input data is greater than or equal to f(N−i+1), a one is output at 1106 and the input data is updated to be the input data minus f(N−i+1)

at 1108. If the input data is less than f(N−i+1) at 1104, a zero is output at 1110. After outputting a zero at 1110 or updating the input data at 1108, it is checked at 1120 if N bits have been output. If so, the process ends, otherwise the bit index i is incremented at 1122 and the last bit output is checked at 1102.

If the last bit output at 1102 is a zero, it is determined at 1130 if the input data is greater than or equal to g(N−i+1). As described above, the input data may be updated in the course of encoding and the current value is used at 1130. If the input data is greater than g(N−i+1), then a zero is output at 1132 and the input data is updated to be the input data minus g(N−i+1) at 1134. If at 1130 the input data is less than g(N−i+1) then a one is output at 1136. After outputting a one at 1136 or updating the input data at 1134, it is checked at 1120 if N bits have been output.

In this example process, the index n in arrays f(n) and g(n) (e.g., examples of which are shown in Table 2 and 3) is a count index, which is different from a bit index i. See, for example, FIG. 5 where the bit index goes from left to right and the count index goes from right to left. To account for this, the arrays f(n) and g(n) are accessed in reverse order (i.e., from the largest value of n to the smallest value of n). Note, for example, steps 1104, 1108, 1130, and 1134 use the elements at N−i+1 in arrays f(n) and g(n). This corresponds to accessing (in order): f(N), f(N−1), f(N−2), . . . , f(1) and g(N), g(N−1), g(N−2), . . . , g(1).

Figure 12:
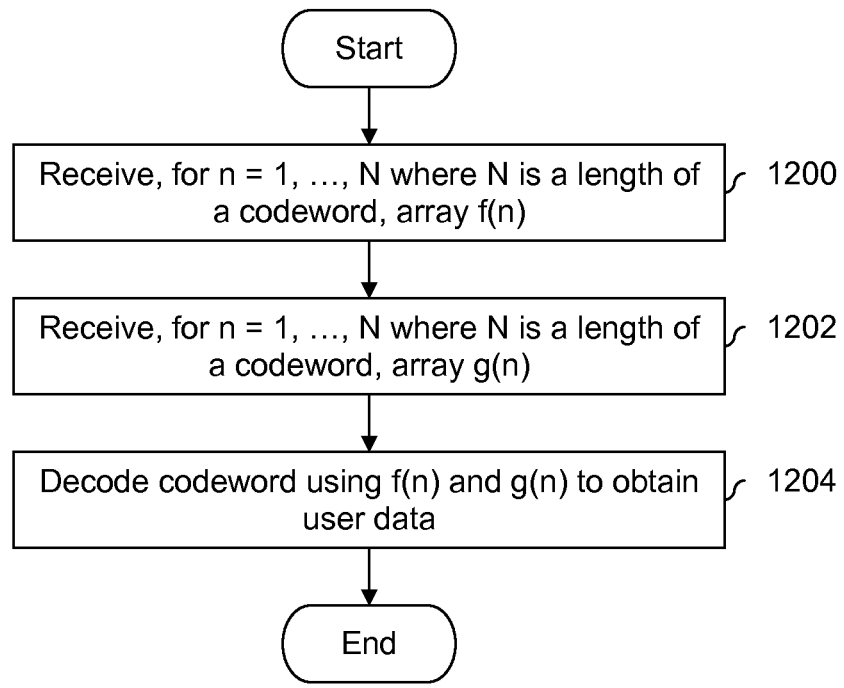
FIG. 12 is flowchart illustrating an embodiment of a process for performing MTR-RLL decoding.

FIG. 12 is flowchart illustrating an embodiment of a process for performing MTR-RLL decoding. In some embodiments, MTR-RLL decoder 914 and/or 964 in FIG. 9 perform(s) the example process shown. The same sequence f(n) and g(n) in the encoding procedure are used. Tables 2 and 3 show examples of arrays f(n) and g(n). A codeword is decoded using f(n) and g(n) to obtain user data at 1204. In some embodiments, at 1204 a codeword is input a bit at a time and user data is updated during the decoding process as each bit of the codeword is input. In some cases, the codeword processed at 1204 includes noise. For example, wireless channel 906 or storage channel 956 may introduce noise into the signal, for example because of the addition or influence of another signal (e.g., from another transmitter or when another location in storage is written to).

Figure 13:
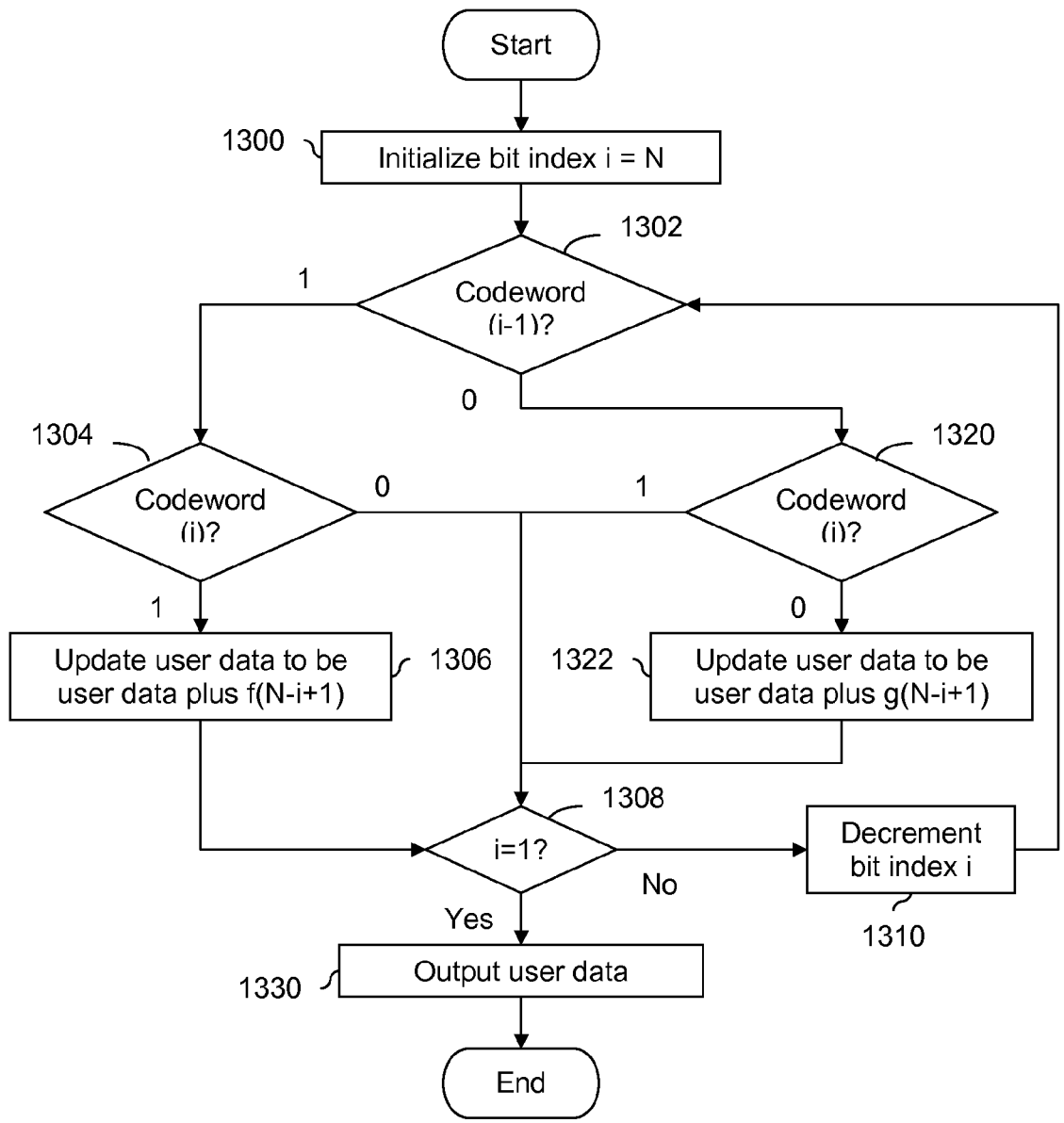
FIG. 13 is a diagram showing an embodiment of a process for performing MTR-RLL decoding, including by adding or subtracting using elements in array f(n) or g(n) as needed.

FIG. 13 is a diagram showing an embodiment of a process for performing MTR-RLL decoding, including by adding or subtracting using elements in array f(n) or g(n) as needed. In the example shown, a codeword (possibly which includes noise and/or is erroneous) is input a bit at a time; at the end of decoding the decoded user data is output. In some embodiments, step 1204 in FIG. 12 is performed using the example process.

At 1300, a bit index i is initialized to i=N. Codeword(i−1) is checked at 1302. For example, a codeword may be a sequence or vector of bits and the value of the (i−1)$^{th}$ bit is checked. If the bit is a one, the process goes to step 1304, otherwise if it is a zero the process goes to step 1320. In some embodiments, for a last iteration (i.e., when i=1), the process is defined or configured to go to either to 1304 or 1320 (e.g., since codeword(0) does not correspond to anything and so it cannot be evaluated at 1302). In this example, when i=1 the process goes to step 1320 from step 1302.

If at 1302 the value of codeword(i−1) is a one, then codeword(i) is checked at 1304. If it is a one then at 1306 the user data is updated to be the user data plus f(N−i+1). After updating the data at 1306 or if codeword(i) is a zero, then at 1308 it is determined if i is 1. Put another way, step 1308 checks if i=1 ( ). If i=1, the user data is output at 1330, otherwise the bit index i is decremented at 1310 and the value of codeword(i−1) is checked at 1302.

If at 1302 the value of codeword(i−1) is a zero then at 1320 codeword(i) is checked. If it is a zero then the user data is updated to be the user data plus g(N−i+1) at 1322. After updating the user data at 1322 or if codeword(i) at 1320 is a one, it is determined at 1308 if i=1.

When the encoder and decoder are implemented in hardware, issues related to addition and subtraction (e.g., between elements in sequences {fn} and {gn} and some value being updated as in 1108 and 1134 in FIG. 11 and in 1306 and 1322 in FIG. 13) arise. The numbers being operated on may be as large as $2^{M-1}$ or $2^M$. To build an adder of M bits may be expensive when M is large. In some embodiments, to mitigate the cost of building such a large component, the sequences {fn} and {gn} are truncated to limited precision. In other words, the elements in the sequences {fn} and {gn} are represented in the form of a x $2b$, where a is an integer of limited bits and b is an integer as well. In this way, an adder requires fewer bits (i.e., less than M, a little bit larger than the number of bits in a).

In some embodiments, to obtain sequences {fn} and {gn} which may be implemented using a truncated adder as describe above, let $f_n = \phi_n 2^{\eta_n - B}$, $g_n = \beta_n 2^{\theta_n - B}$, where $\phi_n$ and $\beta_n$ are integers of B+1 bits, with a MSB set to be 1. The recursive equations in (9) and (10) are each split into two equations, resulting in:

$$\eta_n = \left\lfloor \log_2 \sum_{i=1}^{K(n+1)} \beta_{n-i} 2^{\theta_{n-i} - B} \right\rfloor \tag{13}$$

$$\phi_n = \left\lfloor \frac{1}{2^{\eta_n - B}} \sum_{i=1}^{K(n+1)} \beta_{n-i} 2^{\theta_{n-i} - B} \right\rfloor$$

$$\theta_n = \left\lfloor \log_2 \sum_{i=1}^{T(n+1)} \phi_{n-i} 2^{\eta_{n-i} - B} \right\rfloor \tag{14}$$

$$\beta_n = \left\lfloor \frac{1}{2^{\eta_n - B}} \sum_{i=1}^{T(n+1)} \phi_{n-i} 2^{\eta_{n-i} - B} \right\rfloor$$

The initial condition is $\eta_0 = \theta_0 = 0$, $\phi_{00} = \beta_0 = 2^B$. Because some codewords are lost when truncation is performed, the code rate may suffer from a small B in some cases. In some embodiments, a reduction in a number of codewords and/or the related reduction in code rate is evaluated during the process of designing a decoder or encoder and the tradeoff between hardware savings and reduction in code performance is evaluated with the best tradeoff and truncation selected. The encoding and decoding algorithms are relatively unchanged, except that the subtraction and addition can be limited to a sliding window along the user data (in the case of encoding) and codeword (in the case of decoding).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
an interface configured to:
receive an array f(n), wherein the array f(n) includes N elements and N is the length of a codeword that satisfies an MTR constraint and a RLL constraint; and
receive an array g(n), wherein the array g(n) includes N elements and N is the length of the codeword; and a processor configured to encode input data using the array f(n) and the array g(n) to generate the codeword, including by:
  determining the value of a most recent bit of the codeword that is output;
  in the event the most recent bit is a first value, comparing the input data to an element in the array f(n) corresponding to a current index, wherein the value of a next bit of the codeword that is output depends upon the comparison of the input data to the element in the array f(n); and
  in the event the most recent bit is a second value, comparing the input data to an element in the array g(n) corresponding to the current index, wherein the value of the next bit of the codeword that is output depends upon the comparison of the input data to the element in the array g(n).

2. The system of claim 1, wherein f(n) is associated with a number of paths through a $z_1$ state, in a trellis, which is associated with a run of zeros of run length 1 and g(n) is associated with a number of paths through a $t_1$ state, in the trellis, which is associated with a run of ones of run length 1.

3. The system of claim 1, wherein the first value is a value of one and the second value is a value of zero.

4. The system of claim 1, wherein:
  the processor is configured to compare the input data to the element in the array f(n) that corresponds to the current index by determining if the input data is greater than or equal to the element in the array f(n) that corresponds to the current index; and
  the processor is configured to compare the input data to the element in the array g(n) that corresponds to the current index by determining if the input data is greater than or equal to the element in the array g(n) that corresponds to the current index.

5. The system of claim 4, wherein the processor is further configured to encode the input data by:
  in the event it is determined that the input data is greater than or equal to the element in the array f(n) that corresponds to the current index, updating the input data to be the input data minus the element in the array f(n) that corresponds to the current index; and
  in the event it is determined that the input data is greater than or equal to the element in the array g(n) that corresponds to the current index, updating the input data to be the input data minus the element in the array g(n) that corresponds to the current index.

6. A system, comprising:
an interface configured to:
  receive an array f(n), wherein the array f(n) includes N elements and N is a length of a codeword that satisfies an MTR constraint and a RLL constraint; and
  receive an array g(n), wherein the array g(n) includes N elements and N is the length of the codeword; and
a processor configured to decode the codeword using the array f(n) and the array g(n) to obtain user data, including by:
  determining the value of a first bit of the codeword and the value of a second bit of the codeword, wherein the first bit and the second bit are adjacent to each other;
  in the event the first bit of the codeword and the second bit of the codeword are both a first value, updating the user data to be the user data plus an element in the array f(n) that corresponds to a current index; and
  in the event the first bit of the codeword and the second bit of the codeword are both a second value, updating the user data to be the user data plus an element in the array g(n) that corresponds to the current index.

7. The system of claim 6, wherein f(n) is associated with a number of paths through a $z_1$ state, in a trellis, which is associated with a run of zeros of run length 1 and g(n) is associated with a number of paths through a $t_1$ state, in the trellis, which is associated with a run of ones of run length 1.

8. The system of claim 6, wherein the first value is a value of one and the second value is a value of zero.

9. A method, comprising:
  receiving an array f(n), wherein the array f(n) includes N elements and N is the length of a codeword that satisfies an MTR constraint and a RLL constraint;
  receiving an array g(n), wherein the array g(n) includes N elements and N is the length of the codeword; and
  using a processor to encode input data using the array f(n) and the array g(n) to generate the codeword, including by:
    determining the value of a most recent bit of the codeword that is output;
    in the event the most recent bit is a first value, comparing the input data to an element in the array f(n) corresponding to a current index, wherein the value of a next bit of the codeword that is output depends upon the comparison of the input data to the element in the array f(n); and
    in the event the most recent bit is a second value, comparing the input data to an element in the array g(n) corresponding to the current index, wherein the value of the next bit of the codeword that is output depends upon the comparison of the input data to the element in the array g(n).

10. The method of claim 9, wherein f(n) is associated with a number of paths through a $z_1$ state, in a trellis, which is associated with a run of zeros of run length 1 and g(n) is associated with a number of paths through a $t_1$ state, in the trellis, which is associated with a run of ones of run length 1.

11. The method of claim 9, wherein the first value is a value of one and the second value is a value of zero.

12. The method of claim 9, wherein:
  comparing the input data to the element in the array f(n) that corresponds to the current index includes determining if the input data is greater than or equal to the element in the array f(n) that corresponds to the current index; and
  comparing the input data to the element in the array g(n) that corresponds to the current index includes determining if the input data is greater than or equal to the element in the array g(n) that corresponds to the current index.

13. The method of claim 12, wherein using the processor to encode the input data further includes:
  in the event it is determined that the input data is greater than or equal to the element in the array f(n) that corresponds to the current index, updating the input data to be the input data minus the element in the array f(n) that corresponds to the current index; and
  in the event it is determined that the input data is greater than or equal to the element in the array g(n) that corresponds to the current index, updating the input data to be the input data minus the element in the array g(n) that corresponds to the current index.

14. A method, comprising:
  receiving an array f(n), wherein the array f(n) includes N elements and N is a length of a codeword that satisfies an MTR constraint and a RLL constraint;
  receiving an array g(n), wherein the array g(n) includes N elements and N is the length of the codeword; and using a processor to decode the codeword using the array f(n) and the array g(n) to obtain user data, including by:
- determining the value of a first bit of the codeword and the value of a second bit of the codeword, wherein the first bit and the second bit are adjacent to each other;
- in the event the first bit of the codeword and the second bit of the codeword are both a first value, updating the user data to be the user data plus an element in the array f(n) that corresponds to a current index; and
- in the event the first bit of the codeword and the second bit of the codeword are both a second value, updating the user data to be the user data plus an element in the array g(n) that corresponds to the current index.

15. The method of claim 14, wherein f(n) is associated with a number of paths through a $z_1$ state, in a trellis, which is associated with a run of zeros of run length 1 and g(n) is associated with a number of paths through a $t_1$ state, in the trellis, which is associated with a run of ones of run length 1.

16. The method of claim 14, wherein the first value is a value of one and the second value is a value of zero.

* * * * *